(12) United States Patent
Rendall et al.

(10) Patent No.: US 12,385,141 B2
(45) Date of Patent: Aug. 12, 2025

(54) METHOD AND APPARATUS FOR SPUTTER DEPOSITION OF TARGET MATERIAL TO A SUBSTRATE

(71) Applicant: Dyson Technology Limited, Wiltshire (GB)

(72) Inventors: Michael Edward Rendall, Newbury (GB); Robert Ian Joseph Gruar, Swindon (GB)

(73) Assignee: Dyson Technology Limited, Wiltshire (GB)

( * ) Notice: Subject to any disclaimer, the term of this patent is extended or adjusted under 35 U.S.C. 154(b) by 509 days.

(21) Appl. No.: 17/776,588

(22) PCT Filed: Nov. 10, 2020

(86) PCT No.: PCT/GB2020/052837
§ 371 (c)(1),
(2) Date: May 12, 2022

(87) PCT Pub. No.: WO2021/094720
PCT Pub. Date: May 20, 2021

(65) Prior Publication Data
US 2022/0380903 A1 Dec. 1, 2022

(30) Foreign Application Priority Data
Nov. 15, 2019 (GB) ...................... 1916619

(51) Int. Cl.
*C23C 16/52* (2006.01)
*C23C 16/455* (2006.01)
(52) U.S. Cl.
CPC ........ *C23C 16/52* (2013.01); *C23C 16/45536* (2013.01)
(58) Field of Classification Search
None
See application file for complete search history.

(56) References Cited

U.S. PATENT DOCUMENTS

| 3,829,373 A | 8/1974 | Kuehnle |
| 4,026,787 A | 5/1977 | Kuehnle |

(Continued)

FOREIGN PATENT DOCUMENTS

| CN | 101457343 A | 6/2009 |
| CN | 101527362 A | 9/2009 |

(Continued)

OTHER PUBLICATIONS

International Search Report and Written Opinion received for PCT Patent Application No. PCT/GB2020/052838, mailed on Feb. 18, 2021, 9 pages.

(Continued)

*Primary Examiner* — Jethro M. Pence
(74) *Attorney, Agent, or Firm* — Tucker Ellis LLP

(57) ABSTRACT

An apparatus for sputter deposition of target material to a substrate is disclosed. In one form, the apparatus includes a substrate portion in which a substrate is provided and a target portion in which target material is provided, in use. The target portion and the substrate portion define between them a deposition zone. The apparatus includes an antenna arrangement for generating plasma, in use, and a confining arrangement. The confining arrangement includes a first element between the antenna arrangement and the deposition zone and a second element. The antenna arrangement is between the second element and the deposition zone. The first element confines the plasma towards the deposition zone to provide for sputter deposition of target material to the substrate, in use. The second element confines the plasma away from the second element, towards the antenna arrangement and, via the first element, towards the deposition zone, in use.

16 Claims, 4 Drawing Sheets

(56) References Cited

U.S. PATENT DOCUMENTS

| | | | |
|---|---|---|---|
| 4,278,528 A | | 7/1981 | Kuehnle et al. |
| 4,492,620 A | | 1/1985 | Matsuo et al. |
| 4,849,087 A | | 7/1989 | Meyer |
| 4,935,303 A | * | 6/1990 | Ikoma .................. C23C 16/26 427/571 |
| 4,990,229 A | * | 2/1991 | Campbell ............ H01J 37/3211 204/298.37 |
| 5,091,049 A | * | 2/1992 | Campbell ............ H01J 37/321 427/571 |
| 5,122,251 A | * | 6/1992 | Campbell ............ H01J 37/321 204/298.06 |
| 5,215,638 A | | 6/1993 | Hausler |
| 5,926,689 A | * | 7/1999 | Cote .................. C23C 16/4401 438/10 |
| 6,103,070 A | | 8/2000 | Hong |
| 6,514,390 B1 | * | 2/2003 | Xu ..................... H01J 37/3405 204/192.12 |
| 6,632,563 B1 | | 10/2003 | Krasnov et al. |
| 6,667,240 B2 | * | 12/2003 | Ozaki ................. C23C 16/52 257/53 |
| 6,905,547 B1 | * | 6/2005 | Londergan ........ C23C 16/45544 118/715 |
| 7,242,013 B2 | * | 7/2007 | Fukuda ............... C23C 16/52 250/492.2 |
| 7,453,072 B2 | * | 11/2008 | Fukuda ............... H01J 37/3023 250/492.2 |
| 7,667,212 B2 | * | 2/2010 | Fukuda ............... H01J 37/3023 438/798 |
| 8,859,058 B2 | * | 10/2014 | Dodge ................ C01B 32/26 427/249.8 |
| 8,920,361 B2 | * | 12/2014 | Staack ................ A61B 18/042 604/24 |
| 9,381,056 B2 | * | 7/2016 | Staack ................ B05D 1/62 |
| 9,673,265 B2 | * | 6/2017 | Huh .................... H01L 21/682 |
| 9,738,970 B2 | * | 8/2017 | Dodge ................. C23C 16/56 |
| 9,797,041 B2 | * | 10/2017 | Chen ................... C23C 16/52 |
| 10,214,808 B2 | * | 2/2019 | Huh ................. H01L 21/68742 |
| 10,851,457 B2 | * | 12/2020 | Shaikh .............. C23C 16/45574 |
| 10,982,325 B2 | * | 4/2021 | Kostamo ........... C23C 16/45504 |
| 11,441,222 B2 | * | 9/2022 | Shaikh .............. C23C 16/45574 |
| 2001/0033952 A1 | | 10/2001 | Jenson et al. |
| 2002/0144656 A1 | | 10/2002 | Yoshikawa et al. |
| 2002/0175069 A1 | | 11/2002 | Domoto et al. |
| 2004/0048157 A1 | | 3/2004 | Neudecker et al. |
| 2004/0089535 A1 | | 5/2004 | Wolfe et al. |
| 2004/0118678 A1 | | 6/2004 | Hartig |
| 2006/0134522 A1 | | 6/2006 | Zhang et al. |
| 2006/0196766 A1 | | 9/2006 | Chen |
| 2007/0125638 A1 | | 6/2007 | Zhang et al. |
| 2007/0166612 A1 | | 7/2007 | Krasnov et al. |
| 2007/0181421 A1 | | 8/2007 | Wei et al. |
| 2007/0269612 A1 | * | 11/2007 | Bijker ................... C23C 4/134 118/719 |
| 2008/0023146 A1 | | 1/2008 | Shabalin |
| 2008/0035471 A1 | | 2/2008 | Mikami et al. |
| 2009/0032191 A1 | | 2/2009 | Chistyakov |
| 2009/0057136 A1 | | 3/2009 | Wang et al. |
| 2009/0159429 A1 | | 6/2009 | Tsukamoto |
| 2009/0159433 A1 | | 6/2009 | Neudecker et al. |
| 2009/0159441 A1 | | 6/2009 | Marunaka et al. |
| 2009/0277778 A1 | | 11/2009 | Stowell et al. |
| 2009/0288943 A1 | | 11/2009 | Kwak et al. |
| 2010/0119839 A1 | * | 5/2010 | Chen .................... C09K 11/08 428/421 |
| 2011/0117433 A1 | | 5/2011 | Sabi et al. |
| 2011/0226617 A1 | | 9/2011 | Hofmann et al. |
| 2011/0266141 A1 | | 11/2011 | Drayton et al. |
| 2012/0275008 A1 | | 11/2012 | Pradhan et al. |
| 2012/0315396 A1 | * | 12/2012 | Endo ................. H01J 37/3244 118/723 R |
| 2013/0112546 A1 | | 5/2013 | Brown et al. |
| 2014/0183036 A1 | | 7/2014 | Shao et al. |
| 2015/0016265 A1 | | 1/2015 | Ahmadi |
| 2016/0233541 A1 | | 8/2016 | Anapolsky et al. |
| 2017/0207071 A1 | | 7/2017 | De Bosscher et al. |
| 2018/0245217 A1 | | 8/2018 | Guo |
| 2018/0363141 A1 | * | 12/2018 | Duclos ................. C23C 16/26 |
| 2019/0153589 A1 | | 5/2019 | Puls et al. |
| 2020/0095672 A1 | | 3/2020 | Honma et al. |
| 2020/0263294 A1 | * | 8/2020 | Gicquel ............... C30B 25/16 |
| 2021/0108314 A1 | * | 4/2021 | Shaikh ............... H01L 21/0217 |
| 2021/0327690 A1 | * | 10/2021 | Thwaites ........... H01J 37/3458 |
| 2021/0327691 A1 | * | 10/2021 | Thwaites ........... H01J 37/3458 |
| 2021/0371297 A1 | | 12/2021 | Perkins et al. |
| 2022/0277940 A1 | | 9/2022 | Rendall |
| 2022/0325402 A1 | * | 10/2022 | Rendall ................ C23C 14/26 |
| 2022/0380885 A1 | | 12/2022 | Rendall et al. |
| 2022/0380903 A1 | * | 12/2022 | Rendall ................ C23C 16/52 |
| 2022/0384159 A1 | | 12/2022 | Rendall et al. |
| 2022/0389564 A1 | | 12/2022 | Rendall ............... H01J 37/3266 |
| 2022/0389586 A1 | | 12/2022 | Rendall et al. |
| 2022/0393142 A1 | | 12/2022 | Gruar |
| 2022/0396865 A1 | | 12/2022 | Rendall et al. |
| 2022/0396869 A1 | | 12/2022 | Rendall |
| 2022/0399195 A1 | * | 12/2022 | Rendall ............... H01J 37/3266 |
| 2022/0403499 A1 | | 12/2022 | Rendall et al. |
| 2022/0406565 A1 | * | 12/2022 | Chen ................. C23C 16/45536 |
| 2022/0407043 A1 | | 12/2022 | Rendall et al. |
| 2022/0411913 A1 | | 12/2022 | Gruar |
| 2023/0028207 A1 | * | 1/2023 | Carley ................ H01J 37/3211 |
| 2023/0220539 A1 | | 7/2023 | Rendall et al. |
| 2023/0304141 A1 | * | 9/2023 | Alexander ............. H01J 37/34 |
| 2023/0352270 A1 | * | 11/2023 | Gauter .................. H01J 37/321 |
| 2024/0034635 A1 | * | 2/2024 | Crössmann ......... C23C 16/4411 |
| 2024/0060211 A1 | * | 2/2024 | Crössmann ............ C30B 23/02 |
| 2024/0093408 A1 | * | 3/2024 | Crössmann ........... C23C 16/325 |
| 2024/0309507 A1 | * | 9/2024 | Shaikh ............. C23C 16/45597 |

FOREIGN PATENT DOCUMENTS

| | | |
|---|---|---|
| CN | 101796213 A | 8/2010 |
| CN | 101903560 A | 12/2010 |
| CN | 101970709 A | 2/2011 |
| CN | 102037586 A | 4/2011 |
| CN | 105593395 A | 5/2016 |
| CN | 105874641 A | 8/2016 |
| CN | 105951053 A | 9/2016 |
| CN | 205803586 U | 12/2016 |
| CN | 106684325 A | 5/2017 |
| CN | 108281618 A | 7/2018 |
| CN | 109075006 A | 12/2018 |
| CN | 109402562 A | 3/2019 |
| CN | 109415802 A | 3/2019 |
| CN | 109415804 A | 3/2019 |
| CN | 109477203 A | 3/2019 |
| CN | 109844900 A | 6/2019 |
| CN | 110168130 A | 8/2019 |
| CN | 110349838 A | 10/2019 |
| DE | 4126236 A1 | 2/1993 |
| DE | 4418906 A1 | 12/1995 |
| EP | 0103461 A2 | 3/1984 |
| EP | 0403418 A2 | 12/1990 |
| EP | 0837490 A2 | 4/1998 |
| EP | 1729330 A1 | 12/2006 |
| EP | 2527487 A1 | 11/2012 |
| EP | 3396751 A1 | 10/2018 |
| EP | 3399539 A1 | 11/2018 |
| GB | 1462241 A | 1/1977 |
| GB | 0007173 | 5/2000 |
| GB | 2360530 A | 9/2001 |
| GB | 2572610 A | 10/2019 |
| JP | 49-101273 A | 9/1974 |
| JP | 61-009575 A | 1/1986 |
| JP | 61-093542 A | 5/1986 |
| JP | 03-068773 A | 3/1991 |
| JP | H05-171433 A | 7/1993 |
| JP | 10-150210 A | 6/1998 |
| JP | H10-510676 A | 10/1998 |
| JP | 11-269643 A | 10/1999 |
| JP | 2002-235171 A | 8/2002 |
| JP | 2003-007291 A | 1/2003 |
| JP | 2004-043934 A | 2/2004 |

(56) References Cited

FOREIGN PATENT DOCUMENTS

| | | |
|---|---|---|
| JP | 2006-257546 A | 9/2006 |
| JP | 2006322055 A | 11/2006 |
| JP | 2007-005219 A | 1/2007 |
| JP | 2007-067183 A | 3/2007 |
| JP | 2008-045213 A | 2/2008 |
| JP | 2008-138229 A | 6/2008 |
| JP | 2011-032550 A | 2/2011 |
| JP | 2011-108532 A | 6/2011 |
| JP | 2011-521433 A | 7/2011 |
| JP | 2011-225932 A | 11/2011 |
| JP | 2013-028824 A | 2/2013 |
| JP | 2013-164971 A | 8/2013 |
| JP | 2015193863 A | 11/2015 |
| JP | 2015232158 A | 12/2015 |
| JP | 2017066429 A | 4/2017 |
| JP | 2017-186581 A | 10/2017 |
| JP | 6215329 B2 | 10/2017 |
| JP | 2019-104956 A | 6/2019 |
| KR | 10-2006-0124978 A | 12/2006 |
| KR | 100762698 B1 | 10/2007 |
| KR | 10-2008-0000736 A | 1/2008 |
| KR | 10-2011-0092965 A | 8/2011 |
| KR | 10-2015-0005262 A | 1/2015 |
| KR | 20180049257 A | 5/2018 |
| KR | 101990881 B1 | 6/2019 |
| KR | 20190065233 A | 6/2019 |
| WO | 89/07664 A1 | 8/1989 |
| WO | 02/21627 A2 | 3/2002 |
| WO | 2004/017356 A2 | 2/2004 |
| WO | 2009/143254 A2 | 11/2009 |
| WO | 2010/023878 A1 | 3/2010 |
| WO | 2010/144761 A2 | 12/2010 |
| WO | 2011/131921 A1 | 10/2011 |
| WO | 2014/156129 A1 | 10/2014 |
| WO | 2016/078693 A1 | 5/2016 |
| WO | 2018/001523 A1 | 1/2018 |
| WO | 2018/128009 A1 | 7/2018 |
| WO | 2018/202656 A1 | 11/2018 |
| WO | 2018/225822 A1 | 12/2018 |
| WO | 2019/181095 A1 | 9/2019 |
| WO | 2021/094721 A1 | 5/2021 |
| WO | 2021/094772 A1 | 5/2021 |

OTHER PUBLICATIONS

International Search Report and Written Opinion received for PCT Patent Application No. PCT/GB2020/052893, mailed on Feb. 22, 2021, 11 pages.
International Search Report and Written Opinion received for PCT Patent Application No. PCT/GB2020/052896, mailed on Feb. 22, 2021, 10 pages.
Ribeiro, J. F., et al. "Lithium cobalt oxide crystallization on flexible polyimide substrate." Journal of Materials Science: Materials in Electronics 27 (2016): 631-636.
Office Action received for Japanese Patent Application No. 2022-528191, mailed on Jun. 27, 2023, 14 pages (8 pages of English Translation and 6 pages of Original Document).
Office Action received for Japanese Patent Application No. 2022-528195, mailed on Jun. 27, 2023, 11 pages (6 pages of English Translation and 5 pages of Original Document).
Office Action received for Japanese Patent Application No. 2022-528153, mailed on Jul. 25, 2023, 7 pages (3 pages of English Translation and 4 pages of Original Document).
Akazawa, "Highly adhesive Pt-electrode films directly deposited on SiO2 by electron-cyclotron-resonance plasma sputtering", Surface & Coatings Technology, vol. 204, 2010, pp. 1836-1841.
Combined Search and Examination Report Received for GB Application No. 1916628.9, mailed on May 5, 2020, 6 pages.
Combined Search and Examination Report Received for GB Application No. 1916632.1, mailed on May 5, 2020, 3 pages.
Combined Search and Examination Report Received for GB Application No. 1916633.9, mailed on May 4, 2020, 3 pages.
Combined Search and Examination Report Received for GB Application No. 1916634.7, mailed on May 15, 2020, 3 pages.
Combined Search and Examination Report Received for GB Application No. 1916635.4, mailed on May 5, 2020, 4 pages.
GB Search Report received for Application No. 1916619.8, mailed on May 7, 2020, 1 page.
GB Search Report received for Application No. 1916622.2, mailed on Mar. 30, 2020, 1 page.
GB Search Report received for Application No. 1916624.8, mailed on Apr. 29, 2020, 1 Page.
GB Search Report Received for GB Application No. 1916626.3, mailed on May 12, 2020, 1 page.
GB Search Report Received for GB Application No. 1916629.7, mailed on May 15, 2020, 1 page.
GB Search Report received for Patent Application No. 1916627.1, mailed on May 12, 2020, 1 page.
GB Search Report received for Patent Application No. 1916637.0, mailed on Mar. 30, 2020, 1 Page.
Hayashi et al., "Preparation of positive LiCoO2 films by electron cyclotron resonance (ECR) plasma sputtering method and its application to all-solid-state thin-film lithium batteries", Journal of Power Sources vol. 174, 2007, pp. 990-995.
International Search Report and Written Opinion received for PCT Patent Application No. PCT/GB20/052837, mailed on Feb. 12, 2021, 11 pages.
International Search Report and Written Opinion received for PCT Patent Application No. PCT/GB2020/052839, mailed on Feb. 23, 2021, 11 pages.
International Search Report and Written Opinion received for PCT Patent Application No. PCT/GB2020/052840, mailed on Feb. 25, 2021, 11 pages.
International Search Report and Written Opinion received for PCT Patent Application No. PCT/GB2020/052841, mailed on Mar. 1, 2021, 13 pages.
International Search Report and Written Opinion received for PCT Patent Application No. PCT/GB2020/052842, mailed on Feb. 25, 2021, 11 pages.
International Search Report and Written Opinion received for PCT Patent Application No. PCT/GB2020/052843, mailed on Feb. 26, 2021, 13 pages.
International Search Report and Written Opinion received for PCT Patent Application No. PCT/GB2020/052844, mailed on Feb. 18, 2021, 12 pages.
International Search Report and Written Opinion received for PCT Patent Application No. PCT/GB2020/052848, mailed on Dec. 23, 2020, 10 pages.
International Search Report and Written Opinion received for PCT Patent Application No. PCT/GB2020/052892, mailed on Feb. 25, 2021, 12 pages.
International Search Report and Written Opinion received for PCT Patent Application No. PCT/GB2020/052894, mailed on Mar. 9, 2021, 13 pages.
International Search Report and Written Opinion received for PCT Patent Application No. PCT/GB2020/052895, mailed on Mar. 5, 2021, 12 pages.
International Search Report and Written Opinion received for PCT Patent Application No. PCT/GB2020/052897, mailed on Mar. 3, 2021, 12 pages.
Julien E. et al., "Sputtered LiCoO2 Cathode Materials for All-solid-state Thin-film Lithium Microbatteries," Materials, vol. 12, No. 17, 2019, 2687, pp. 26.
Knox-Davies et al., "Properties of nanocrystalline GaN films deposited by reactive sputtering," Diamond and Related Materials, Elsevier Science Publishers, vol. 12, No. 8, 2003, pp. 1417-1421.
Office Action received for Japanese Patent Application No. 2022-528173, mailed on Aug. 1, 2023, 4 pages (2 pages of English Translation and 2 pages of Original Document).
Office Action received for Japanese Patent Application No. 2022-528178, mailed on Aug. 8, 2023, 6 pages (3 pages of English Translation and 3 pages of Original Document).
Office Action received for Japanese Patent Application No. 2022-528188, mailed on Aug. 8, 2023, 6 pages (3 pages of English Translation and 3 pages of Original Document).

(56) References Cited

OTHER PUBLICATIONS

Office Action received for Japanese Patent Application No. 2022-528189, mailed on Aug. 8, 2023, 6 pages (3 pages of English Translation and 3 pages of Original Document).
Office Action received for Japanese Patent Application No. 2022-528195, mailed on Oct. 17, 2023, 10 pages (6 pages of English Translation and 4 pages of Original Document).

* cited by examiner

METHOD AND APPARATUS FOR SPUTTER DEPOSITION OF TARGET MATERIAL TO A SUBSTRATE

CROSS-REFERENCE TO PRIOR APPLICATION

This application is a § 371 National Stage Application of PCT International Application No. PCT/GB2020/052837 filed Nov. 10, 2020, which claims the priority of United Kingdom Application No. 1916619.8, filed Nov. 15, 2019, each of which are herein incorporated by reference in their entirety.

TECHNICAL FIELD

The present invention relates to deposition, and more particularly to methods and apparatuses for sputter deposition of target material to a substrate.

BACKGROUND

Deposition is a process by which target material is deposited on a substrate. An example of deposition is thin film deposition in which a thin layer (typically from around a nanometre or even a fraction of a nanometre up to several micrometres or even tens of micrometres) is deposited on a substrate, such as a silicon wafer or web. An example technique for thin film deposition is Physical Vapor Deposition (PVD), in which target material in a condensed phase is vaporised to produce a vapor, which vapor is then condensed onto the substrate surface. An example of PVD is sputter deposition, in which particles are ejected from the target as a result of bombardment by energetic particles, such as ions. In examples of sputter deposition, a sputter gas, such as an inert gas, such as Argon, is introduced into a vacuum chamber at low pressure, and the sputter gas is ionised using energetic electrons to create a plasma. Bombardment of the target by ions of the plasma eject target material which may then deposit on the substrate surface. Sputter deposition has advantages over other thin film deposition methods such as evaporation in that target materials may be deposited without the need to heat the target material, which may in turn reduce or prevent thermal damage to the substrate.

A known sputter deposition technique employs a magnetron, in which a glow discharge is combined with a magnetic field that causes an increase in plasma density in a circular shaped region close to the target. The increase of plasma density can lead to an increased deposition rate. However, use of magnetrons results in a circular "racetrack" shaped erosion profile of the target, which limits the utilisation of the target and can negatively affect the uniformity of the resultant deposition.

It is desirable to provide uniform and/or efficient sputter deposition to allow for improved utility in industrial applications.

SUMMARY

According to a first aspect of the present invention, there is provided an apparatus for sputter deposition of target material to a substrate, the apparatus comprising:
   a substrate portion in which a substrate is provided in use;
   a target portion spaced from the substrate portion and in which target material is provided in use, the target portion and the substrate portion defining between them a deposition zone;
   an antenna arrangement comprising at least one antenna for generating plasma when an alternating current is driven through the antenna in use;
   a confining arrangement comprising:
      at least one first element disposed between the antenna arrangement and the deposition zone and arranged to, in use, confine the plasma from the antenna arrangement towards the deposition zone, thereby to provide for sputter deposition of target material to the substrate in use; and
      at least one second element disposed such that the antenna arrangement is between the at least one second element and the deposition zone, and arranged to, in use, confine the plasma away from the second element, towards the antenna arrangement and thereby, via the at least one first element, towards the deposition zone.

By using the confining arrangement, the plasma may be at least partly confined within the deposition zone. The density of the plasma within the deposition zone may therefore be increased, which may increase the efficiency of sputter deposition of the target material on the substrate. A more uniform density of plasma may also or alternatively be provided within the deposition zone. This may allow, in turn, for a more uniform deposition of the target material on the substrate.

In examples, at least one said first element is a first magnetic element arranged to provide a first confining magnetic field to confine the plasma from the antenna arrangement towards the deposition zone. The first confining magnetic field may be used to effectively confine the plasma at least partly within the deposition zone. For example, the first confining magnetic field may be characterised by magnetic field lines in a configuration to provide for a more uniform density of the plasma within the deposition zone.

In these examples, the first magnetic element may be an electromagnet controllable to provide the first confining magnetic field. By controlling the electromagnet, the strength of the first confining magnetic field provided may, in turn, be controlled. This may allow for adjustment of a density of the plasma in the deposition zone, which may be used to adjust deposition of the target material on the substrate. Hence, control over the sputter deposition may be improved, improving the flexibility of the apparatus. In these examples, the apparatus may comprise a controller arranged to control the first confining magnetic field provided by the first magnetic element.

In examples in which the at least one said first element is a first magnetic element, the first magnetic element may be a solenoid having an opening via which the plasma is confined in use. Confining the plasma via the opening of the solenoid may increase the density of the plasma within the deposition zone. For example, a quantity of plasma may be compressed or otherwise constricted to pass through the opening of the solenoid. In such examples, the at least one antenna may be elongate, and the opening of the solenoid may be elongate in a direction substantially parallel to a direction in which the at least one antenna is elongate. With such an arrangement, the plasma may be generated along the length of the at least one elongate antenna and may be confined by the elongate opening of the solenoid in the form of a sheet. The sheet may be more uniform than other arrangements of plasma and may allow for an increased area of the substrate and/or target material to be exposed to the plasma. This may increase the efficiency of sputter deposition and may alternatively or additionally provide for more uniform deposition of the target material on the substrate. In these examples, the antenna arrangement may comprise two antennas, and the solenoid may be arranged such that the opening of the solenoid opens into an area defined between the two antennas. This may allow for accurate confinement of the plasma at least partly within the deposition zone. For example, the area between the two antennas may correspond to an area with a higher density of plasma, which may have a more uniform density of plasma, across a larger area than otherwise. A larger area of the substrate and/or target material may therefore be exposed to the plasma, improving the efficiency of the sputter deposition process.

In some examples in which at least one said first element is a first magnetic element, at least one said second element is a second magnetic element arranged to provide a second confining magnetic field to, at least in a volume intermediate of the first element and the second element, oppose the first confining magnetic field thereby to confine the plasma away from the second magnetic element, towards the antennas arrangement and thereby, via the first element, towards the deposition zone. The second magnetic element may improve confinement of the plasma at least partly within the deposition zone, by providing a suitable second confining magnetic field. For example, without the at least one said second element, the plasma may not be confined within the deposition zone, and may instead 'over spill' away from the deposition zone. This can reduce the deposition efficiency. This may also or alternatively reduce a power coupling between the plasma and rf power provided via the antenna arrangement, which may require an increase in rf power. By providing the at least one said second element, for example as a second magnetic element, 'over spilling' of the plasma may be reduced. The density of the plasma within the deposition may, in turn, be increased. The power coupling between the rf power provided by the antenna arrangement and the plasma may also or alternatively be increased.

In these examples, the second confining magnetic field may be arranged to, in a volume intermediate of the first element and the second element, reduce the magnetic flux of the first confining magnetic field along a direction between the first element and the second element. Reducing the magnetic flux in this way may cause the plasma to be confined with a higher density in the deposition zone. This may increase deposition efficiency.

In these examples, the second magnetic element may be an electromagnet controllable to provide the second confining magnetic field. In examples in which the second magnetic element is an electromagnet, the apparatus may comprise a controller arranged to control the second confining magnetic field provided by the second magnetic element. As explained with reference to the first magnetic element, this allows the second confining magnetic field to be controlled appropriately. This may allow for adjustment of a density of the plasma in the deposition zone, which may be used to adjust deposition of the target material on the substrate.

In examples, at least one said second element is an electrostatic element controllable to provide an electric field to, at least in a volume intermediate of the first element and the second element, repel at least a portion of the plasma from the electrostatic element, towards the antennas arrangement and thereby, via the first element, towards the deposition zone. This may further improve confinement of the plasma at least partly within the deposition zone. In these examples, the electrostatic element may be arranged to be positively charged in use thereby to repel positively charged ions of the plasma. This may reduce improve confinement of the positively charged ions of the plasma within the deposition zone, by reducing or otherwise limiting motion of the positively charged ions away from the deposition zone. In these examples, the apparatus may comprise a controller arranged to control the electric field provided by the electrostatic element. The controlled may be used to control the extent to which the plasma is repelled from the electrostatic element and hence the density of the plasma within the deposition zone. In this way, a desired density of plasma within the deposition zone may be obtained, improving the flexibility of the apparatus.

In examples, the confining arrangement comprises at least two said first elements disposed such that the deposition zone is between a first of the first elements and a second of the first elements, thereby to confine the plasma through the deposition zone. By providing the at least two first elements at an appropriate distance with respect to each other, a desired plasma density may be obtained.

In examples, the confining arrangement comprises a third element disposed such that the deposition zone is between the second element and the third element, the third element being arranged to confine the plasma away from the third element and towards the deposition zone. The third element may further improve confinement of the plasma at least partly within the deposition zone. In turn, the plasma density in the deposition zone may be increased, which may increase the deposition efficiency of the apparatus.

In these examples, the third element may be disposed such that the first of the first elements and the second of the first elements and the deposition zone are between the third element and the second element, such that the third element confines the plasma away from the third element and, via one of the first of the first elements and the second of the first elements, towards the deposition zone. By suitable arrangement of the first, second and third elements, the plasma density may be further increased in the deposition zone.

In examples, the target portion is controllable to provide the target material with a negative electric charge in use, thereby to attract positively charged ions of the plasma. This may cause the plasma density to increase towards the target material, which may increase the efficiency of the sputter deposition.

In examples, the apparatus comprises a web feed assembly arranged to provide a web of substrate in the substrate portion in use. In these examples, the apparatus may form part of a "reel-to-reel" deposition system, which is for example more efficient than a batch process.

According to a second aspect of the present invention, there is provided a method of sputter deposition of target material to a substrate, wherein a deposition zone is defined between the substrate and the target material, the method comprising:
  generating plasma using an antenna arrangement comprising at least one antenna;
  confining, using at least one first element disposed between the antenna arrangement and the deposition zone, the plasma from the antenna arrangement towards the deposition zone thereby to cause sputter deposition of the target material to the substrate; and
  confining, using at least one second element disposed such that the antenna arrangement is between the at least one second element and the deposition zone, the plasma away from the second element, towards the antenna arrangement and thereby, via the first element, towards the deposition zone.

This method may increase the density of the plasma within the deposition zone, which may improve the efficiency of sputter deposition. This method may also or alternatively increase the uniformity of the plasma within the deposition zone, which may improve the uniformity of the target material deposited on the substrate.

According to a third aspect of the present invention, there is provided an apparatus for sputter deposition of target material to a substrate, the apparatus comprising:
  a deposition zone;
  an antenna arrangement comprising at least one antenna for generating plasma when an alternating current is driven through the antenna in use;
  a confining arrangement comprising:
    at least one first element disposed between the antenna arrangement and the deposition zone and arranged to, in use, confine the plasma from the antenna arrangement towards the deposition zone, thereby to provide plasma to the deposition zone in use; and
  at least one second element disposed such that the antenna arrangement is between the at least one second element and the deposition zone, and arranged to, in use, confine the plasma away from the second element, towards the antenna arrangement and thereby, via the at least one first element, towards the deposition zone.

This may increase the density of the plasma within the deposition zone, which may improve the efficiency of sputter deposition. This method may also or alternatively increase the uniformity of the plasma within the deposition zone, which may improve the uniformity of the target material deposited on the substrate.

Further features will become apparent from the following description, given by way of example only, which is made with reference to the accompanying drawings.

DETAILED DESCRIPTION

Details of apparatuses and methods according to examples will become apparent from the following description, with reference to the Figures. In this description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Figure 1:
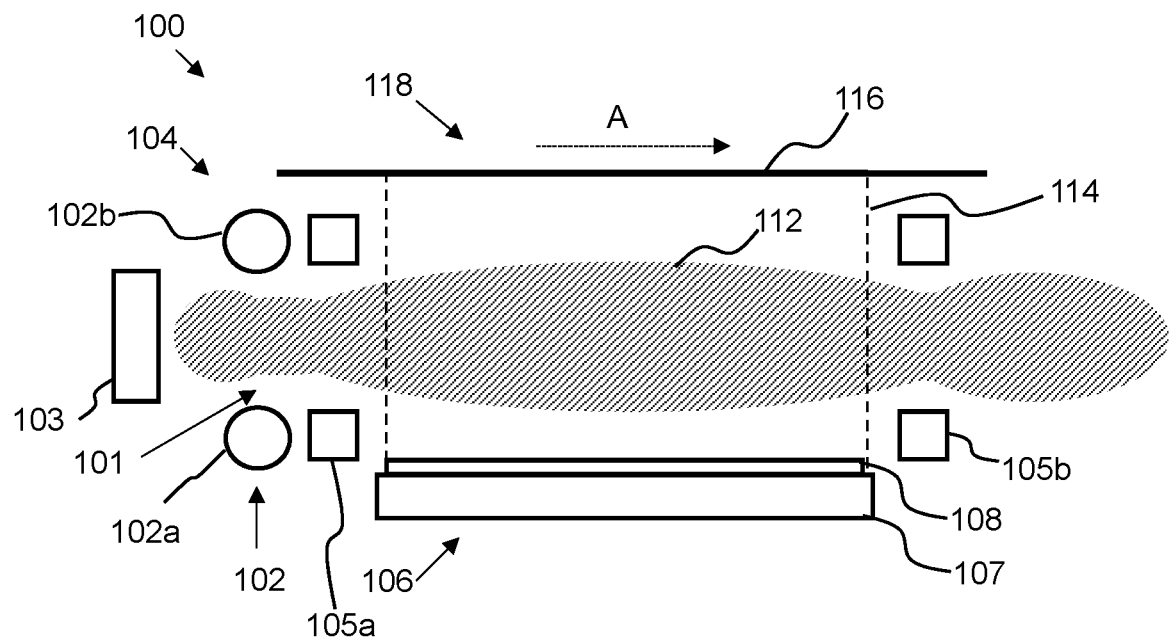
FIG. 1 is a schematic diagram that illustrates a cross section of an apparatus according to an example.

Referring to FIG. 1, an example apparatus 100 for sputter deposition of target material 108 to a substrate 116 is schematically illustrated.

The apparatus 100 may be used for plasma-based sputter deposition for a wide number of industrial applications, such as those which have utility for the deposition of thin films, such as in the production of optical coatings, magnetic recording media, electronic semiconductor devices, LEDs, energy generation devices such as thin-film solar cells, and energy storage devices such as thin-film batteries. Therefore, while the context of the present disclosure may in some cases relate to the production of energy storage devices or portions thereof, it will be appreciated that the apparatus 100 and method described herein are not limited to the production thereof.

Although not shown in the Figures for clarity, it is to be appreciated that the apparatus 100 may be provided within a housing (not shown), which in use may be evacuated to a low pressure suitable for sputter deposition, for example $3\times10^{-3}$ torr. For example, the housing (not shown) may be evacuated by a pumping system (not shown) to a suitable pressure (for example less than $1\times10^{-5}$ torr), and in use a process or sputter gas, such as argon or nitrogen, may be introduced into the housing (not shown) using a gas feed system (not shown) to an extent such that a pressure suitable for sputter deposition is achieved (for example $3\times10^{-3}$ torr).

Returning to the example illustrated in FIG. 1, in broad overview, the apparatus 100 comprises a substrate portion 118, a target portion 106, an antenna arrangement 102, and a confining arrangement 104.

The substrate portion 118 is a portion of the apparatus 100 in which a substrate 116 is provided in use. In some examples, the substrate portion 118 may comprise a substrate guide (not shown in FIG. 1) to guide the substrate 116 through the apparatus 100. For example, the substrate guide (not shown in FIG. 1) may guide the substrate 116 in a conveyance direction (indicated by arrow A in FIG. 1).

In some examples, the substrate 116 may be in the form of a web of substrate 116. In some examples, the web of substrate 116 may be or comprise silicon or a polymer. In some examples, for example for the production of an energy storage device, the web of substrate 116 may be or comprise nickel foil, but it will be appreciated that any suitable metal could be used instead of nickel, such as aluminium, copper or steel, or a metallised material including metallised plastics such as aluminium on polyethylene terephthalate (PET).

The target portion 106 is a portion of the apparatus 100 in which target material 108 is provided in use. The target portion 106 may comprise a target support 107 arranged to support target material 108. For example, the target support 107 may comprise a plate or other support structure that supports or holds the target material 108 in place during sputter deposition. The target material 108 may be a material on the basis of which the sputter deposition onto the substrate 116 is to be performed. For example, the target material 108 may be or comprise material that is to be deposited onto the substrate 116 by sputter deposition.

In some examples, for example for the production of an energy storage device, the target material 108 may be or comprise, or may be or comprise a precursor material for, a cathode layer of an energy storage device, such as a material which is suitable for storing Lithium ions, such as Lithium Cobalt Oxide, Lithium Iron Phosphate or alkali metal polysulphide salts. Additionally or alternatively, the target material 108 may be or comprise, or may be or comprise a precursor material for, an anode layer of an energy storage device, such as Lithium metal, Graphite, Silicon or Indium Tin Oxides. Additionally or alternatively, the target material 108 may be or comprise, or may be or comprise a precursor material for, an electrolyte layer of an energy storage device, such as material which is ionically conductive, but which is also an electrical insulator, such as lithium phosphorous oxynitride (LiPON). For example, the target material 108 may be or comprise LiPO as a precursor material for the deposition of LiPON onto the substrate 116, for example, via reaction with Nitrogen gas in the region of the target material 108.

The target portion 106 and the substrate portion 118 are spaced apart from one another and define between them a deposition zone 114. The deposition zone 114 may be taken as the area or volume between the substrate portion 118 and the target portion 106 in which sputter deposition from the target material 108 onto the web of substrate 116 occurs in use. For example the deposition zone 114 may be taken as the area or volume between the substrate 116 received in the apparatus 100 in use and the target material 108 received in the apparatus 100 in use, in which sputter deposition from the target material 108 onto the web of substrate 116 occurs in use.

The antenna arrangement 102 comprises at least one antenna 102a, 102b, for generating plasma when an alternating current is driven through the antenna 102a, 102b in use. In the illustrated example, the antenna arrangement 102 comprises two antennas 102a, 102b. Appropriate radio frequency power may be driven through one or both of the antennas, 102a, 102b, by a radio frequency power supply system (not shown) so as to generate an inductively coupled plasma 112 from the process or sputter gas in the housing (not shown). In some examples, plasma 112 may be generated by driving a radio frequency current through the one or more antennas 102a, 102b, for example at a frequency between 1 MHz and 1 GHz; a frequency between 1 MHz and 100 MHz; a frequency between 10 MHz and 40 MHz; or at a frequency of approximately 13.56 MHz or multiples thereof. In any event, the radio frequency power causes ionisation of the process or sputter gas to produce plasma 112.

In the illustrated examples, the antenna arrangement 102 is disposed remotely of the deposition zone 114. As such, plasma 112 may be generated remotely from the deposition zone 114. The antennas 102a, 102b may extend substantially parallel to one another and may be disposed laterally from one another. This may allow for a precise generation of an elongate region of plasma 112 between the two antennas 102a, 102b, which may in turn help provide for precise confining of the generated plasma 112 to the deposition zone 114, as described in more detail below. In some examples, the antennas 120a, 120b may be similar in length to the width of the substrate 116 carried in the substrate portion 118. The elongate antennas 102a, 102b may provide for plasma 112 to be generated across a region having a length corresponding to the width of the substrate 116, and hence may allow for plasma 112 to be available evenly or uniformly across the width of the substrate 116. As described in more detail below, this may in turn help provide for even or uniform sputter deposition.

The confining arrangement 104 comprises at least one first element 105a and at least one second element 103.

The at least one first element 105a is disposed between the antenna arrangement 102 and the deposition zone 114. The first element 105a is arranged to confine the plasma 112 from the antenna arrangement 104 towards the deposition zone 114, thereby to provide for sputter deposition of target material 108 to the substrate 116.

In some examples, the confined plasma 112 may, at least in the deposition zone 114, be high density plasma. For example, the confined plasma 112 may have, at least in the deposition zone 114, a density of $10^{11}$ cm$^{-3}$ or more, for example. Plasma 112 of high density in the deposition zone 114 may allow for effective and/or high rate sputter deposition.

In some examples, the at least one first element 105a may be a first magnetic element 105a arranged to provide a first confining magnetic field to confine the plasma from the antenna arrangement 102 towards the deposition zone 114. The confining magnetic field may be characterised by magnetic field lines (not shown in FIG. 1) arranged to follow a path from the antenna arrangement 102 towards the deposition zone 114. The generated plasma 112 tends to follow the magnetic field lines, and hence is confined by the at least one first element from the antenna arrangement 102 towards the deposition zone 114. For example, ions of the plasma within the confining magnetic field and with some initial velocity will experience a Lorentz force that causes the ion to follow a periodic motion around the magnetic field line. If the initial motion is not strictly perpendicular to the magnetic field, the ion follows a helical path centred on the magnetic field line. The plasma containing such ions therefore tends to follow the magnetic field lines and hence is confined on a path or plane defined thereby. Accordingly, the first magnetic element 105a may be suitably arranged so that the plasma 112 will be confined by the confining magnetic field towards the deposition zone 114.

In some examples, the at least one magnetic element 105a may be arranged to provide a confining magnetic field characterised by magnetic field lines which, at least in the deposition zone 114, follow a path substantially parallel to that of the substrate 116 and/or the target material 108. This may allow for more uniform distribution of plasma 112 across the deposition zone 114, which may in turn allow for a more uniform deposition of target material 112.

In some examples, as illustrated, the confining arrangement may comprise two first elements 105a, 105b. The first elements 105a, 105b may be disposed such that the deposition zone 114 is between a first 105a of the first elements 105a, 105b, and a second 105b of the first elements 1051, 105b, so as to confine the plasma 112 through the deposition zone 114. For example, the first elements 105a, 105b may be magnetic elements 105a, 105b. The magnetic elements 105a, 105b may be arranged to provide together a confining magnetic field that confines the plasma 112 from the antenna arrangement 102, through the deposition zone 114 (i.e. substantially from one side of the deposition zone 114 to the other). For example, the at least two magnetic elements 105a, 105b may be arranged such that a region of relatively high magnetic field strength is provided between the magnetic elements 105a, 105b. The region of relatively high magnetic field strength may extend through the deposition zone 114. The confining magnetic field produced by the magnetic elements 105a, 105b may be characterised by magnetic field lines which, at least in the deposition zone 114, follow a path substantially parallel to that of the substrate 116 and/or the target material 108. This may allow for a more uniform plasma density to be provided across substantially the entire deposition zone 114, which may allow, in turn, for a more uniform deposition of target material 116 across substantially the entire deposition zone 114.

In some examples, at least one of the first magnetic elements 105a, 105b may be an electromagnet controllable to provide the first confining magnetic field. For example, one or both of the first magnetic elements 105a, 105b may be an electromagnet 104a, 104b. The apparatus 100 may comprise a controller (not shown) arranged to control a strength of the magnetic field provided by one or more of the electromagnets 105a, 105b. This may allow for the confining magnetic field, for example the arrangement of the magnetic field lines that characterise the confining magnetic field, to be controlled. This may allow for adjustment of plasma density at the substrate 116 and or the target material 108 and hence for improved control over the sputter deposition. This may allow for improved flexibility in the operation of the apparatus 100.

In some examples, at least one of the first magnetic elements 105a, 105b may be provided by a solenoid 105a, 105b. Each solenoid 105a, 105b may define an opening (not shown in FIG. 5, but see opening 650 of FIG. 6) through or via which plasma 112 is confined (may pass) in use.

In some examples, the solenoid 105a, 105b may be elongate. For example, as perhaps best seen in FIG. 6, the opening 650 defined by the solenoid 105a, 105b may be elongate. As perhaps best appreciated from FIG. 5, the opening 505 of the solenoid 105a, 105b may be elongate in a direction substantially parallel to a direction in which the antenna 102a, 102b is elongate. As described above, plasma 112 may be generated along the length of the elongate antennas 102a, 102b, and the elongate solenoid 105a may confine the plasma 112 in a direction away from the elongate antennas 102a, 102b, and through the elongate solenoid 105a. The plasma 112 may be confined from the elongate antennas 102a, 102b by the elongate solenoid 105a in the form of a sheet. That is, in a form in which the depth (or thickness) of the plasma 112 is substantially less than its length and/or width. The thickness of the sheet of plasma 112 may be substantially constant along the length and width of the sheet. The density of the sheet of plasma 112 may be substantially uniform in one or both of its width and length directions. The plasma 112, in the form of a sheet, may be confined by the magnetic field provided by the solenoid 105a, 105b towards and/or through the deposition zone 114. The plasma 112 may thereby be confined in the form of a sheet. Confining the plasma 112 in the form of a sheet may allow for an increased area of the substrate 116 and/or target material 108 to be exposed to the plasma 112, and hence for an increased area in which sputter deposition may be effected. This may allow, for example, for an increased deposition rate per unit area of substrate, and hence, in turn, for more efficient deposition. This may alternatively or additionally allow for a more uniform distribution of plasma density at the substrate 116 and or target material 108 across the deposition zone 114. This may in turn allow for a more uniform sputter deposition onto the substrate 116. The sputter deposition may therefore, in turn, be performed more consistently. This may, for example, improve the consistency of the processed substrate, and may for example, reduce the need for quality control.

Returning to FIG. 1, as mentioned, the antenna arrangement 102 may comprise two antenna 102a, 102b. The antenna 102a, 102b may be spaced part from one another, and define between them an area 101. The area 101 may be an area 101 in which plasma 112 is preferentially generated by the antennas 105a, 105b in use. The antenna 102a, 102b may be spaced apart from one another in a direction substantially perpendicular to the direction in which each of the antenna 102a, 102b is elongate. The antenna 102a, 102b may be spaced apart from one another in a direction substantially perpendicular to a direction along which the plasma 112 is confined by the confining arrangement 104.

The solenoid 105a may be arranged such that the opening 505 of the solenoid 105a opens into the area 101 defined between the two antennas 102a, 102b. This may allow for accurate confining of plasma 112 by the first solenoid 105a away from the antenna arrangement 102 towards the deposition zone 114.

As illustrated, there may be two solenoids 105a, 105b with the deposition zone 114 being located therebetween. As illustrated, the generated plasma 112 may pass, from the antenna arrangement 102, through a first of the solenoids 105a, into the deposition zone 114, and towards and through the second of the solenoids 105b. The second of the solenoids 105b may have anyone or combination of features of the first solenoid 105a described above.

Although only two first magnetic elements 105a, 105b are shown in FIG. 1, it will be appreciated that further first magnetic elements (not shown), for example further such solenoids (not shown) as solenoid 105a, 105b may be placed along the path of the plasma 112. This may allow for strengthening of the confining magnetic field and hence for precise confining and/or may allow for more degrees of freedom in the control of the confining magnetic field.

The at least one first element 105a, 105b may not, by itself, be able to confine the plasma 112 completely in the deposition zone 114. As an illustrative example, in FIG. 1, the plasma 112 extends out past the first element 105b, i.e. towards an opposite side of the first element 105b than the side towards which the deposition zone 114 is disposed. This plasma may, for example, go onto to ground onto the chamber walls of the housing (not shown). 'Over spilling' of plasma 112 of this kind away from the deposition zone 114 may cause a reduction in plasma 112 density in the deposition zone 114. This may, in turn, cause a reduction in the deposition efficiency, i.e. could lead to slower deposition. Alternatively, or additionally, this may, reduce a power coupling between the plasma and the rf power provided via the antenna 102a, 102b, which may require an increase in rf power provided to the antenna to compensate for. To mitigate such a potential reduction in plasma density and/or power coupling caused by such 'over spilling' in the region of the first element 105a, the confining arrangement 104 comprises at least one second element 103.

The at least one second element 103 is disposed such that the antenna arrangement 102 is between the at least one second element 103 and the deposition zone 114. That is, the second element 103 may be disposed such that the antennas 102a, 102b are between the second element 103 and the deposition zone 114. The second element 103 is arranged to confine the plasma 112 away from the second element 103, towards the antenna arrangement 102 (i.e. antenna 102a, 102b) and thereby, via the at least one first element 105a, towards the deposition zone 115. The at least one second element 103 may therefore cause an increase in the plasma (ion) density in the deposition zone 114, for example as compared to if the second element 103 where not provided. This may, in turn, allow for an improved deposition efficiency of target material 108 to the substrate 116. Alternatively or additionally, this may allow for an improvement of the power coupling between the antenna 102a, 102b and the plasma 112 in the deposition zone 114, and therefore may allow for the antenna to be provided with relatively less power. As described in more detail below a similar arrangement may optionally be provided to prevent or reduce such 'over spilling' in the region of the second first element 105b too, and accordingly further increase the plasma density in the deposition zone 114, which may allow for further corresponding improvements in the deposition efficiency and/or power coupling.

Figure 6:
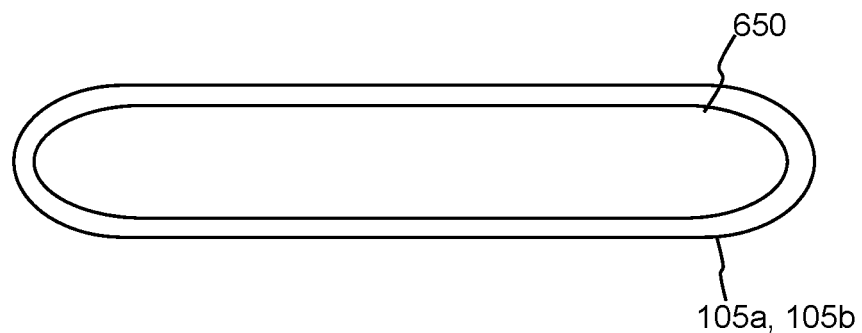
FIG. 6 is a schematic diagram that illustrates a cross section of a first magnetic element according to an example.

The second element 103 may, similarly to the first element 105a, be elongate and extend in a direction parallel to the direction in which the antennas 102a, 102b and or the first element 105a, are elongate (as perhaps best seen in FIG. 6). This may provide for the density of the plasma 112 in the deposition zone to be increased by the second element 103 in a uniform manner across the width of the substrate 118.

In some examples, the at least one second element 103 may be or comprise an electrostatic element 103. The electrostatic element 103 mat be controllable to provide an electric field to, at least in a volume intermediate of the first element 105a and the second element 103, repel at least a portion of the plasma 112 from the electrostatic element 103, towards the antennas arrangement 102 and thereby, via the first element 105a, towards the deposition zone 114. For example, the electrostatic element 103 may be arranged to be positively charged in use thereby to repel positively charged ions of the plasma 112 towards the deposition zone. Repelling the plasma 112 from the second element 103 by providing a suitable electric field may, in turn, discourage plasma 112 from being confined from the antenna 102a, 102b away from the deposition zone 114 and instead cause the plasma 112 to be preferentially confined by the first element 105 a towards the deposition zone 114. Accordingly, the second element 103 may cause the plasma 112 to be confined away from the second magnetic element 103, towards the antennas arrangement 102 and thereby, via the first element 105a, towards the deposition zone 114.

In some examples, the apparatus may comprise a controller (not shown) arranged to control the electric field provided by the electrostatic element 103. For example, a positive voltage may be applied to the electrostatic element 103 by a suitable voltage source (not shown), in order to repel positively charged ions of the plasma 112 towards the deposition zone. The controller (not shown) may be arranged to control the voltage provided to the electrostatic element 103, thereby to control the extent to which the plasma 112 is repelled from the electrostatic element 103, and hence the extent to which the density of the plasma may be increased in the deposition zone 114.

In some examples, the apparatus 100 may be arranged to bias the target material 108 in use with a negative electric charge. This may be provided by a suitable voltage source (not shown), which may be controlled by a controller (not shown). The negative bias on the target material 108 coupled with the positive bias on the second element 103 may encourage the plasma to be confined towards the deposition zone 104.

In some examples, the second element 103 may be or comprise a second magnetic element 103. The second magnetic element 103 may be arranged to provide a second confining magnetic field. The second magnetic field may, at least in a volume 230 intermediate of the first element 105a and the second element 103, oppose the first confining magnetic field provided by the first element 105a. This may cause the plasma 112 to be confined away from the second magnetic element 103, towards the antennas arrangement 102 and thereby, via the first element 105a, towards the deposition zone 114.

Figure 2:
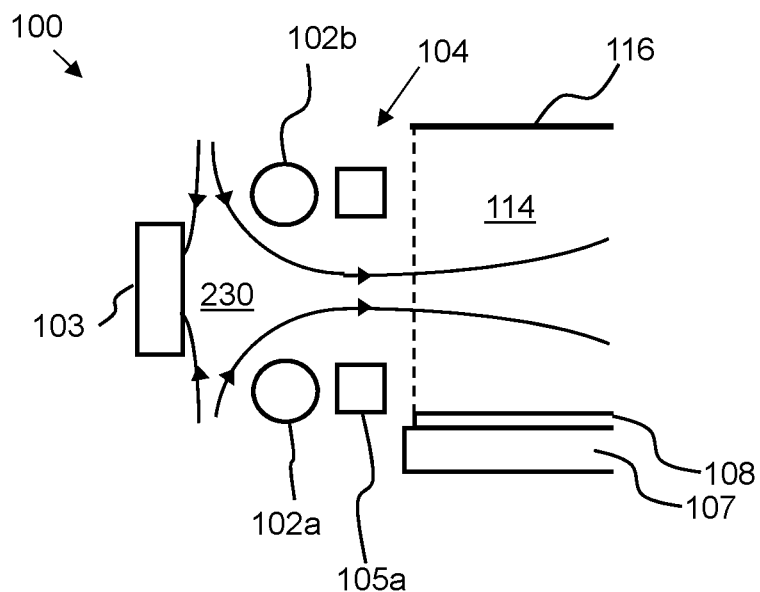
FIG. 2 is a schematic diagram that illustrates a cross section of a portion of the apparatus of FIG. 1, according to an example.

For example, referring to FIG. 2, there is illustrated schematically a portion of the apparatus 100 of FIG. 1, showing schematically magnetic field lines (indicated as is convention by arrowed lines) characterising the interaction of the first confining magnetic field provided by the first magnetic element 105a (a solenoid 105a) and the second confining magnetic field provided by the second magnetic element 103, according to an example. The second magnetic element 103 is arranged to have a polarity opposite to that of the first magnetic element 105a. Accordingly, at least in the volume 230 intermediate of the first element 105a and the second element 103, the magnetic field provided by the second magnetic element 103 opposes the first confining magnetic field provided by the first element 105a. The second confining magnetic field provided by second element 103a accordingly reduces the flux of the first confining magnetic field provided by the first magnetic element 105a in a volume 230 behind the first element 105a relative to the deposition zone 114. For example, the second confining magnetic field provided by second element 103a, in the volume 230, may reduce the magnetic flux of the first confining magnetic field provided by the first magnetic element 105a, along a direction between the first element 105a and the second element 103. Reducing the flux of the first confining magnetic field provided by the first magnetic element 105a in a volume 230 behind the first element 105a relative to the deposition zone 114 may, in turn, discourage plasma 112 from being confined from the antenna 102a, 102b away from the deposition zone 114 and instead cause the plasma 112 to be preferentially confined towards the deposition zone 114. Accordingly, the second element 103 may cause the plasma 112 to be confined away from the second magnetic element 103, towards the antennas arrangement 102 and thereby, via the first element 105a, towards the deposition zone 114.

In some examples, the second element 103 may comprise a permanent magnet with the suitable pole facing the first element 105a to oppose the magnetic field produced thereby. In some examples, the second element 103 may comprise a number of permanent magnets, for example arranged in array, for example each with the suitable pole facing the first element 105a to oppose the magnetic field produced thereby.

In some examples, the second element 103 may be or comprise one or more electromagnets controllable to provide the second confining magnetic field. For example, the second element 103 may comprise an array of solenoids (not shown) controllable to present a suitable pole facing the first element 105a to oppose the magnetic field produced thereby. The apparatus 100 may comprise a controller (not shown) arranged to control the second confining magnetic field provided by the second magnetic element 103. This may allow for control over the interaction of the second confining magnetic field with the first confining magnetic field, and hence control over the extent to which the plasma 112 is confined away from the second element 103 towards the deposition zone 114.

Figure 3:
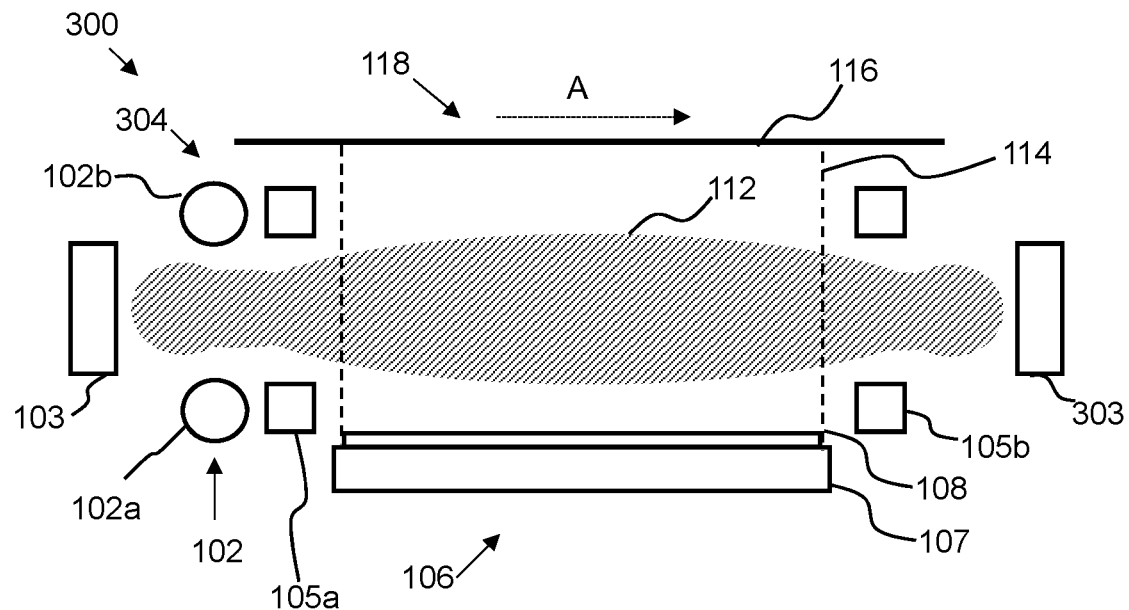
FIG. 3 is a schematic diagram that illustrates a cross section of an apparatus according to yet another example.

Referring to FIG. 3, there is illustrated an apparatus 300 according to an example. The apparatus 300 may be substantially the same as the apparatus 100 described above with reference to FIG. 1 and/or FIG. 2, and like features are denoted by like reference signs. However, the confining arrangement 304 of the example apparatus 300 illustrated in FIG. 3 additionally comprises a third element 303.

The third element 303, similarly to the second element 103, confines plasma away from the third element 303 towards the deposition zone 114. The third element 303 may be the same as, or may have any one or combination of features of, the second element 103 described with reference to FIGS. 1 and 2. As illustrated in FIG. 3, the third element 303 is disposed such that the deposition zone 114 is between the second element 102 and the third element 303. The third element 203 is arranged to confine the plasma 112 away from the third element 303 and towards the deposition zone 114. In this example, the third element 303 is disposed such that the first 105a of the first elements 105a, 105b and the second 105b of the first elements 105a, 105b and the deposition zone 114 are between the third element 303 and the second element 103, such that the third element 303 confines the plasma 112 away from the third element 303 and, via the second 105b of the first elements 105a, 105b, towards the deposition zone 114.

The provision of the third element 303 may therefore cause a (further) increase in the plasma density in the deposition zone 114, for example as compared to if the third element 303 were not provided (i.e. as per FIG. 1). This may, in turn, allow for an improved deposition efficiency of target material 108 to the substrate 116 and/or for improved power coupling from the antenna 102a, 102b to the plasma 112 in the deposition zone 114.

Figure 4:
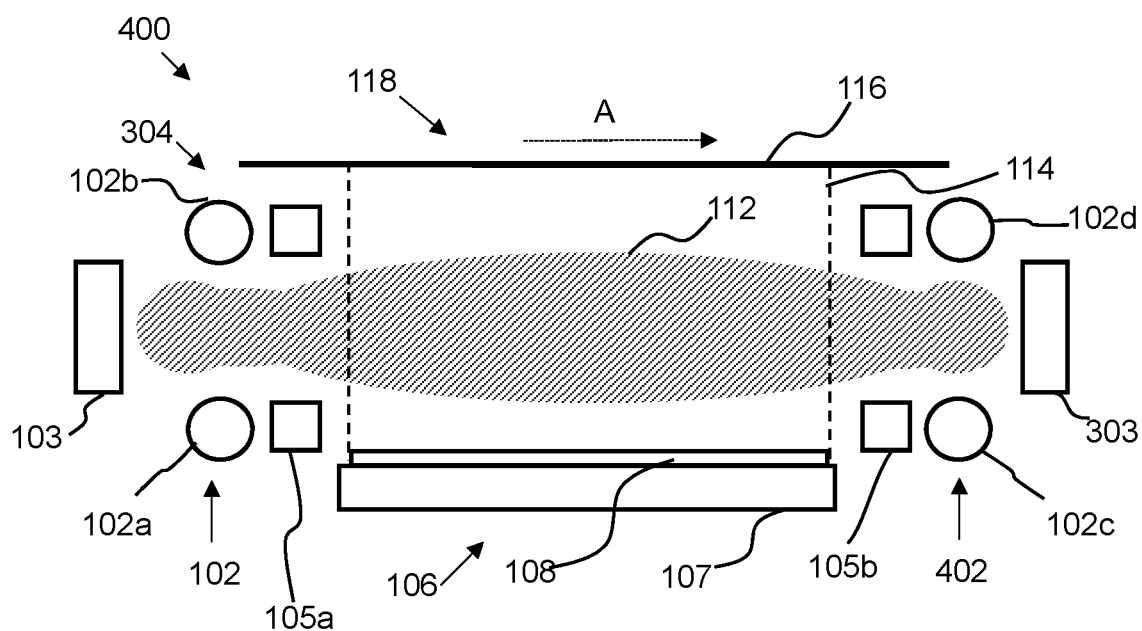
FIG. 4 is a schematic diagram that illustrates a cross section of an apparatus according to yet another example.
Figure 5:
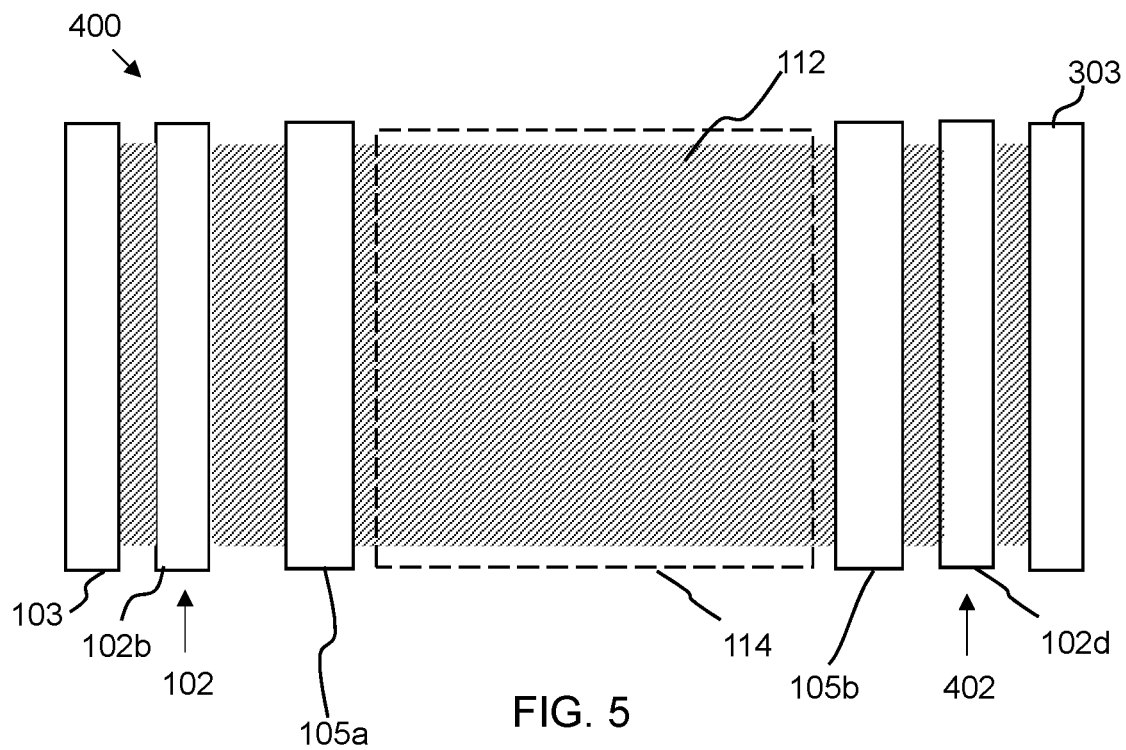
FIG. 5 is a schematic diagram that illustrates a plan view of the apparatus of FIG. 4.

Referring to FIGS. 4 and 5, there is illustrated an example apparatus 400 according to an example, in cross section (FIG. 4) and in plan view (FIG. 5). The apparatus 300 may be substantially the same as the apparatus 300 described above with reference to FIG. 3, and like features are denoted by like reference signs. However, the example apparatus 400 illustrated in FIGS. 4 and 5 comprises a further antenna arrangement 402 comprising a third antenna 102c and a fourth antenna 102d.

As illustrated, the third element 203 is disposed such that the further antenna arrangement 402 is between the third element 203 and the deposition zone 114, and the third element 203 confines the plasma away from the third element 203 (towards the further antenna arrangement 402) and thereby, via the first element 105b, towards the deposition zone 114. The third and fourth antennas 102c, 102d of the further antenna arrangement 402 may be substantially the same as the first and second 102a, 102b antennas of the antenna arrangement 102 described above. It will be appreciated that the arrangement and function of the third element 203, the further antenna arrangement 402, and the first element 105b may be substantially the same as the arrangement and function of the second element 103, the antenna arrangement 102, and the first element 105a described above, but the former being provided on the other side of the deposition zone 114 as compared to the latter. Providing the third and fourth antennas 102a, 102d in this way may allow for a more uniform plasma density and/or distribution across the deposition zone 114, and hence may in turn provide for improved deposition.

Referring to FIG. 6, there is illustrated a cross section of an example of a first magnetic element 105a, 105b. As illustrated, the first magnetic element 105a, 105b is a solenoid and comprises an opening 650 via which plasma is confined in use. The first magnetic element 105a, 105b, and the opening 650 defined thereby, is elongate. As described above, the first element 105a, 105b may be elongate in a direction parallel to a direction in which the antenna arrangement 102, 402 is elongate, thereby to provide for a sheet of plasma 112 to be confined in the deposition zone 114.

In the examples described with reference to FIGS. 1 to 6, the plasma 112, the substrate 116 and the target 108 are substantially planar, but this need not necessarily be the case and in other examples the plasma 112, the substrate 116 and/or the target portion 108 may be substantially curved.

Figure 7:
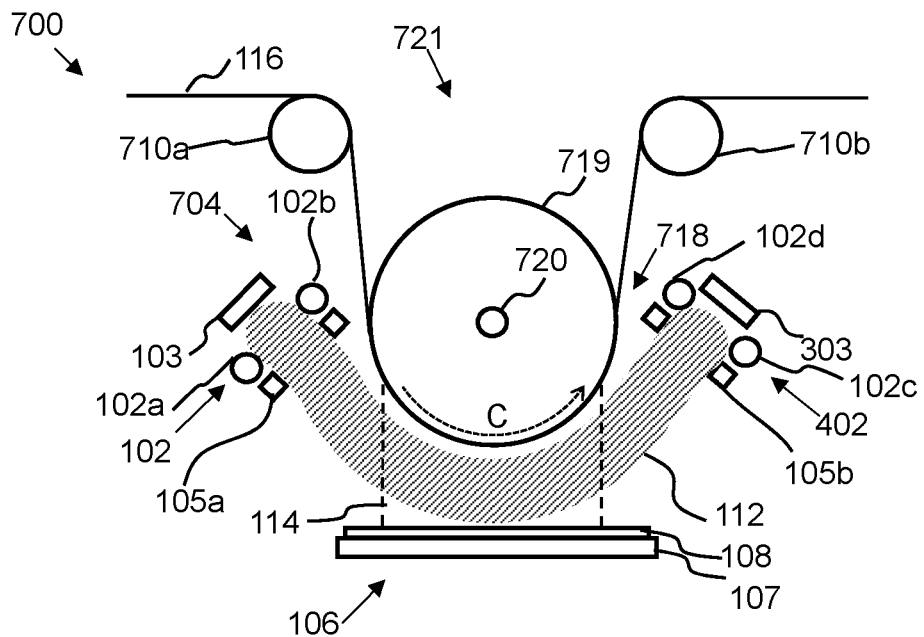
FIG. 7 is a schematic diagram that illustrates a cross section of an apparatus according to yet another example.

Referring to FIG. 7, there is illustrated schematically an apparatus 700 according to an example. The apparatus 700 is similar to the example apparatus 400 described above with reference to FIGS. 4 and 5, and like features are denoted with like reference signs. However, in the apparatus 700 of FIG. 7, the substrate portion 718 is arranged to guide the substrate 116 along a curved path (arrow C in FIG. 7), and the confining arrangement 704 is arranged to confine the plasma to follow a curve of the curved path C.

The substrate portion 718 may comprise a substrate guide 719 which may be or comprise a curved member. As per the example illustrated in FIG. 7, the curved member may be in the form of a drum 719 of an overall web-feed assembly 721. The drum 719 may be arranged to rotate about an axis 720. The web feed assembly 721 may be arranged to feed a web of substrate 116 onto and from the drum 719 such that the web of substrate 116 is carried by at least part of a curved surface of the drum 719. In some examples, the web feed assembly 721 comprises a first roller 710a arranged to feed the web of substrate 116 onto the drum 719, and a second roller 710b arranged to feed the web of substrate 116 from the drum 719, after the web of substrate 116 has followed the curved path C. The web feed assembly 721 may be part of a "reel-to-reel" process arrangement (not shown), where the web of substrate 116 is fed from a first reel or bobbin (not shown) of substrate web 116, passes through the apparatus 700, and is then fed onto a second reel or bobbin (not shown) to form a loaded reel of processed substrate web (not shown).

In this example, the confining arrangement 704 is arranged such that the confining magnetic field provided by the first elements 105a, 105b may be characterised by magnetic field lines arranged to follow a curve of the curved path C. For example, the magnetic field lines (not shown in FIG. 7) may follow a curved path that has a common centre of curvature with the curved path C, but which has a different, in the illustrated examples larger, radius of curvature than the curved path C. For example, the magnetic field lines may follow a curved path that is substantially parallel to but radially offset from the curved path C of the substrate 116. The magnetic field lines characterising the confining magnetic field may be arranged to follow the curve of the curved path C around a substantial or significant sector or portion of the curved path C, for example over all or a substantial part of the notional sector of the curved path C over which the substrate 116 is guided, for example around at least about 1/16 or at least about 1/8 or at least about 1/4 or at least about 1/2 of the circumference of the notional circle. In examples where the first elements 105a, 105b, are provided by solenoids, similarly to as described with reference to FIGS. 1 to 6, the confining arrangement 704 may confine the plasma 112 in the form of a curved sheet.

Confining the plasma 112 to follow a curve of the curved path C of the substrate 116 may allow for an increased area of the substrate 116 to be exposed to the plasma 112, and hence for an increased area in which sputter deposition may be effected, for a given apparatus footprint. This may allow, for example, for the web of substrate 116 to be fed through a reel-to-reel type apparatus at a faster rate for a given degree of deposition, and hence for more efficient sputter deposition.

In some examples (not shown), the target portion 706 may be curved, and may substantially follow the curve of the curved path C. This may allow to maximise the surface area of the web of substrate 116 carried by the drum 118 onto which target material 108 may be deposited.

In the example of FIG. 7, a first element 105a is disposed between the antenna arrangement 102 and the deposition zone 114 and arranged to confine the plasma 112 from the antenna arrangement 102 towards the deposition zone 114, thereby to provide for sputter deposition of target material 108 to the substrate 116. The second element 103 is disposed such that the antenna arrangement 102 is between the second element 103 and the deposition zone 114, and is arranged to confine the plasma 112 away from the second element 103, towards the antenna arrangement 201 and thereby, via the first element 105a, towards the deposition zone 114. The third element 303 is disposed such that the deposition zone is between the third element 303 and the second element 103. The third element 303 is disposed such that the further antenna arrangement 402 is between the third element 303 and the deposition zone 114. The third element 303 is arranged to confine the plasma 112 away from the third element 303, towards the further antenna arrangement 402 and thereby, via a second first element 105b, towards the deposition zone 114. The second element 103 and/or the third element 303 thereby act to increase the plasma density in the deposition zone 114 as compared to if the second and/or third element 103, 303 were not provided. This may, in turn, allow for an improved deposition efficiency of target material 108 to the substrate 116 and/or for an improvement of the power coupling between the antenna arrangement 102 or further antenna arrangement 402 and the plasma 112 in the deposition zone 114, and therefore may allow for the antennas to be provided with relatively less power, thereby to provide a more efficient apparatus.

Figure 8:
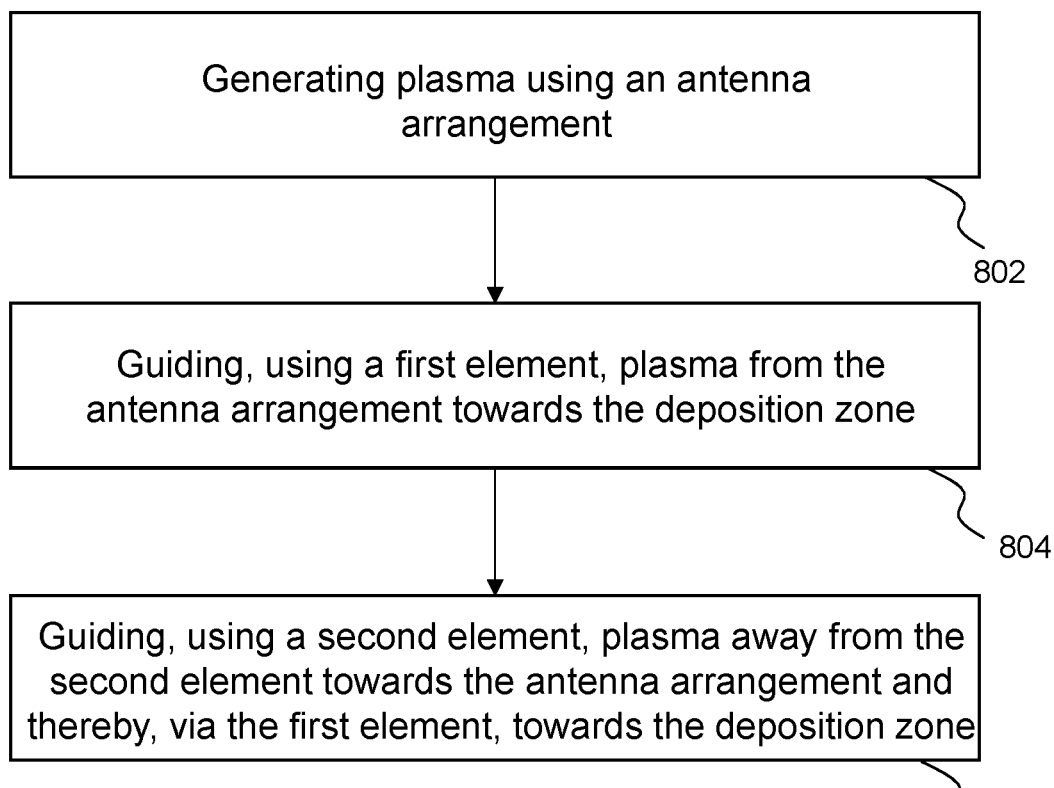
FIG. 8 is a schematic flow diagram that illustrates a method according to an example.

Referring to FIG. 8, there is illustrated schematically an example method of sputter deposition of target material 108 to a substrate 116. In the method, a deposition zone 114 is defined between the substrate 116 and the target material 108. The target material 108, the substrate 116 and the deposition zone 114 may be, for example, those of any of the examples described with reference to FIGS. 1 to 7. In some examples, the method may be performed by any one of the apparatuses 100, 300, 400, 700 described above with reference to FIGS. 1 to 7.

In step 802, the method comprises generating plasma 112 using an antenna arrangement 102 comprising at least one antenna 102a, 102b. For example, the antenna arrangement 102 may be the antenna arrangement 102 described above with reference to FIGS. 1 to 7.

In step 804, the method comprises confining, using at least one first element 105a disposed between the antenna arrangement 201 and the deposition zone 114, the plasma 112 from the antenna arrangement 201 towards the deposition zone 114 thereby to cause sputter deposition of the target material 108 to the substrate 116. For example, the first element 105a may be the first element 105a described above with reference to FIGS. 1 to 7.

In step 804, the method comprises confining, using at least one second element 103 disposed such that the antenna arrangement 102 is between the at least one second element 103 and the deposition zone 114, the plasma 112 away from the second element 103, towards the antenna arrangement 102 and thereby, via the first element 105a, towards the deposition zone 114. For example, the second element 103 may be the second element 103 described above with reference to FIGS. 1 to 7.

As mentioned above, confining the plasma 112 away from the second element 103, towards the antenna arrangement 102 and thereby, via the first element 105a, towards the deposition zone 114 may cause an increase in the plasma (ion) density in the deposition zone 114, for example as compared to if the confining using the second element 103 were not performed. This may, in turn, allow for an improved deposition efficiency of target material 108 to the substrate 116. Alternatively or additionally, this may allow for an improvement of the power coupling between the antenna 102a, 102b and the plasma 112 in the deposition zone 114, and therefore may allow for the antenna to be provided with relatively less power. A more efficient sputter deposition may therefore be provided.

The above examples are to be understood as illustrative examples of the invention. It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the invention, which is defined in the accompanying claims.

The invention claimed is:

1. An apparatus for sputter deposition of target material to a substrate, the apparatus comprising:
a substrate portion configured to provide a substrate;
a target portion spaced from the substrate portion and configured to provide a target material, the target portion and the substrate portion defining between them a deposition zone;
an antenna arrangement comprising at least one antenna configured to generate plasma when an alternating current is driven through the antenna;
a confining arrangement comprising:
at least two first elements configured to confine the plasma from the antenna arrangement towards and through the deposition zone, thereby to provide for sputter deposition of target material to the substrate, wherein the at least two first elements are a first magnetic element which is a first solenoid and a second magnetic element which is a second solenoid, wherein each of the first and second solenoids have an opening configured to confine the plasma through the opening, wherein the first solenoid is disposed between the antenna arrangement and the deposition zone and between the substrate portion and the target portion, and the second solenoid is disposed on an opposite side of the deposition zone from the first solenoid and between the substrate portion and the target portion; and
at least one second element disposed such that the antenna arrangement is between the at least one second element and the deposition zone, and configured to confine the plasma away from the second element, towards the antenna arrangement and thereby, via the first solenoid, towards the deposition zone.

2. The apparatus according to claim 1, wherein the apparatus comprises a controller arranged to control the first confining magnetic field provided by the first solenoid.

3. The apparatus according to claim 1, wherein the at least one antenna is elongate, and the opening of the first solenoid is elongate in a direction substantially parallel to a direction in which the at least one antenna is elongate.

4. The apparatus according to claim 1, wherein the antenna arrangement comprises two antennas, and wherein the first solenoid is configured such that the opening of the first solenoid opens into an area defined between the two antennas.

5. The apparatus according to claim 1, wherein the at least one second element is a second magnetic element configured to provide a second confining magnetic field to, at least in a volume intermediate of the first element and the second element, oppose the first confining magnetic field thereby to confine the plasma away from the second magnetic element, towards the antenna arrangement and thereby, via the first solenoid, towards the deposition zone.

6. The apparatus according to claim 5, wherein the second confining magnetic field is configured to, in a volume intermediate of the first solenoid and the second element, reduce a magnetic flux of the first confining magnetic field along a direction between the first solenoid and the second element.

7. The apparatus according to claim 5, wherein the second magnetic element is an electromagnet controllable to provide the second confining magnetic field.

8. The apparatus according to claim 7, wherein the apparatus comprises a controller configured to control the second confining magnetic field provided by the second magnetic element.

9. The apparatus according to claim 1, wherein the at least one second element is an electrostatic element controllable to provide an electric field to, at least in a volume intermediate of the first solenoid and the electrostatic element, repel at least a portion of the plasma from the electrostatic element, towards the antenna arrangement and thereby, via the first solenoid, towards the deposition zone.

10. The apparatus according to claim 9, wherein the electrostatic element is configured to be positively charged thereby to repel positively charged ions of the plasma.

11. The apparatus according to claim 9, wherein the apparatus comprises a controller configured to control the electric field provided by the electrostatic element.

12. The apparatus according to claim 1, wherein the confining arrangement comprises a third element disposed such that the deposition zone is between the second element and the third element, the third element being configured to confine the plasma away from the third element and towards the deposition zone.

13. The apparatus according to claim 12, wherein the third element is disposed such that the first solenoid and the second solenoid and the deposition zone are between the third element and the second element, such that the third element confines the plasma away from the third element and, via the second solenoid, towards the deposition zone.

14. The apparatus according to claim 1, wherein the target portion is controllable to provide the target material with a negative electric charge, thereby to attract positively charged ions of the plasma.

15. The apparatus according to claim 1, wherein the apparatus comprises a web feed assembly configured to provide a web of substrate in the substrate portion.

16. A method of sputter deposition of target material to a substrate using the apparatus according to claim 1, wherein the deposition zone is defined between the substrate and the target material, the method comprising:
generating plasma using the antenna arrangement comprising the at least one antenna;
confining, using the at least two first elements disposed between the antenna arrangement and the deposition zone, the plasma from the antenna arrangement towards the deposition zone thereby to cause sputter deposition of the target material to the substrate; and
confining, using the at least one second element disposed such that the antenna arrangement is between the at least one second element and the deposition zone, the plasma away from the second element, towards the antenna arrangement and thereby, via the first solenoid, towards the deposition zone.

* * * * *